United States Patent [19]

Takahashi

[11] Patent Number: 5,237,194
[45] Date of Patent: Aug. 17, 1993

[54] POWER SEMICONDUCTOR DEVICE

[75] Inventor: Mitsuasa Takahashi, Tokyo, Japan
[73] Assignee: NEC Corporation, Japan
[21] Appl. No.: 690,585
[22] Filed: Apr. 24, 1991
[30] Foreign Application Priority Data

Apr. 27, 1990 [JP] Japan .................................. 2-112397

[51] Int. Cl.$^5$ ........................................ H01L 29/10
[52] U.S. Cl. ................................ 257/337; 257/467; 307/354
[58] Field of Search ............... 357/28, 23.4, 23.14, 357/41, 42; 257/337, 338, 341, 467, 470; 307/354, 362

[56] References Cited

U.S. PATENT DOCUMENTS

| | | | |
|---|---|---|---|
| 4,893,158 | 1/1990 | Mihara et al. | 357/23.4 |
| 4,896,199 | 1/1990 | Tsuzuki et al. | 357/23.4 |
| 4,928,159 | 5/1990 | Mihara et al. | 357/23.4 |
| 4,931,844 | 5/1990 | Zommer | 357/23.4 |
| 5,063,307 | 11/1991 | Zommer | 357/28 |
| 5,100,829 | 3/1992 | Fay et al. | 357/28 |

FOREIGN PATENT DOCUMENTS

| | | | |
|---|---|---|---|
| 63-229758 | 9/1988 | Japan | 357/28 |
| 1-262667 | 10/1989 | Japan | 357/28 |

Primary Examiner—Andrew J. James
Assistant Examiner—Courtney A. Bowers
Attorney, Agent, or Firm—Laff, Whitesel, Conte & Saret

[57] ABSTRACT

A power semiconductor device is constructed by integrating a DMOS transistor and a lateral MOS transistor on the same semiconductor chip. The lateral MOS transistor is formed within a well with a conductivity type which is the same as the conductivity type of the source region of the DMOS transistor. The gate voltage is monitored at the time of connecting the gate and the drain of the lateral MOS transistor and of driving it at a constant current. When the gate voltage drops below a predetermined value, the driving of the DMOS transistor is stopped. The breakdown of the power semiconductor device due to heating can thus be prevented.

2 Claims, 5 Drawing Sheets

# POWER SEMICONDUCTOR DEVICE

BACKGROUND OF THE INVENTION

The present invention relates to a power semiconductor device, and more particularly to a power semiconductor device constructed by a field effect transistor.

For the purpose of use as a power semiconductor device a vertical field effect transistor, and more specifically a DMOS transistor of vertical double-diffusion structure in which channel length is defined by diffusions for forming base and source regions and is, hereinafter, used under the above-mentioned meanings is considered promising.

Taking the case of N channel as an example, a DMOS transistor is formed in a semiconductor chip that has an N⁻ type epitaxial layer formed on an N⁺ type semiconductor layer. In the epitaxial layer on the surface part of the semiconductor chip there is formed a P type base region, and an N⁺ type source region is formed within the base region. Of the N⁻ type epitaxial layer of the semiconductor chip the part where the base region is not formed is the drain region. A gate insulating film is formed on the base region in between the source region and the drain region, and a gate electrode is formed on the gate insulating electrode.

Actually, the gate electrode is arranged on the gate insulating film in a meshlike form. The source region is formed in a manner self-aligned with the gate electrode. Namely, a large number of DMOS cells are built in parallel in the semiconductor chip.

When the source electrode (an electrode connected to the source region) is grounded, the drain electrode (an electrode on the rear surface of the semiconductor chip) is biased positively and a positive voltage is applied to the gate electrode, an N type inversion layer (channel) is formed on the surface part of the base region below the gate electrode, and a current flows from the drain electrode through the N⁺ type semiconductor layer, the N⁻ type epitaxial layer, the N type inversion layer and the source region. Accordingly, by connecting a load between a power supply and the drain electrode it becomes possible to drive the load. Further, by reducing the voltage applied to the gate electrode it is possible to interrupt the current and stop the driving of the load, so that the load can also be given the function of a semiconductor switch.

The driving current of such a power semiconductor device is set at a desired level in the range of 1 to 10 amperes. Because of the flow of such a high current in a power semiconductor device there exists a possibility of giving damage to the power semiconductor device due to overheating. In the past, prevention of such a thermal breakdown required a damage preventive mechanism of complex structure with an extremely large area for the semiconductor chip which was an obstruction to putting it to practical use. For the prevention of the thermal breakdown it is important as a first step to be able to detect the temperature of the chip.

BRIEF SUMMARY OF THE INVENTION

It is a major object of the present invention to provide a power semiconductor device with simple structure which can detect the temperature of a semiconductor chip.

It is another object of the present invention to provide a power semiconductor device which has a built-in temperature detection cell and enables to control the operating condition of a semiconductor chip to a practical range.

The power semiconductor device in accordance with the present invention includes a semiconductor chip which has a DMOS transistor and a lateral MOS transistor that are integrated within the same chip. The conductivity types of the channels of the DMOS transistor and the lateral MOS transistor are the same. A well with the same conductivity type as that of the base region of the DMOS transistor is provided independently, and the lateral MOS transistor is provided in the well part.

The gate voltage for maintaining the drain current at a predetermined value when the drain electrode and the gate electrode of the lateral MOS transistor are connected is a linear function of the temperature of the semiconductor chip. Accordingly, it is possible to use the device as a temperature detection cell with simple structure without unduly increasing the chip area and without complexity in structure.

BRIEF DESCRIPTION OF THE DRAWINGS

The above-mentioned objects, features and advantages of this invention will become more apparent by reference to the following detailed description of the invention taken in conjunction with the accompanying drawings, wherein.

DETAILED DESCRIPTION OF THE PREFERRED EMBODIMENT

Referring to FIG. 1 to FIG. 5, an embodiment of the present invention will be described.

Figure 1:
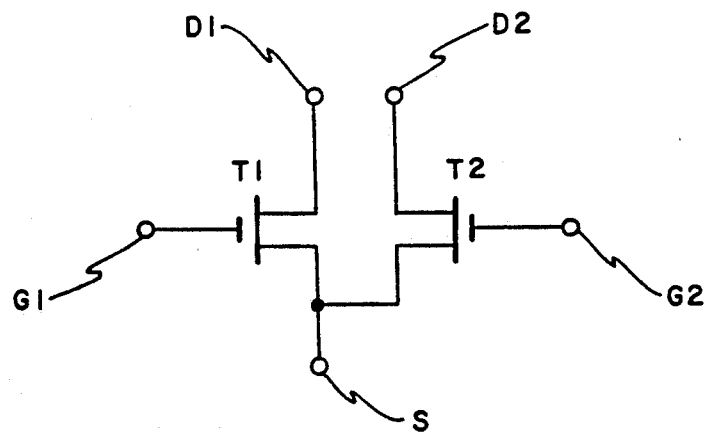
FIG. 1 is a circuit diagram for the power semiconductor device in accordance with the present invention.

The circuit diagram for the power semiconductor device of the present invention is shown in FIG. 1.

A vertical field effect transistor T1 has a construction in which a large number of DMOS cells are connected in parallel. Namely, a large capacity transistor as a whole is constructed by commonly connecting the gates, the drains and the sources of a large number of cell transistors to a first gate terminal G1, a first drain terminal D1 and a source terminal S, respectively. The circuit has a lateral MOS transistor T2 whose gate, drain and source are connected to a second gate terminal G2, a second drain terminal D2 and the common source terminal S, respectively.

The vertical field effect transistor T1 and the lateral MOS transistor T2 are integrated on one semiconductor chip.

Figure 2:
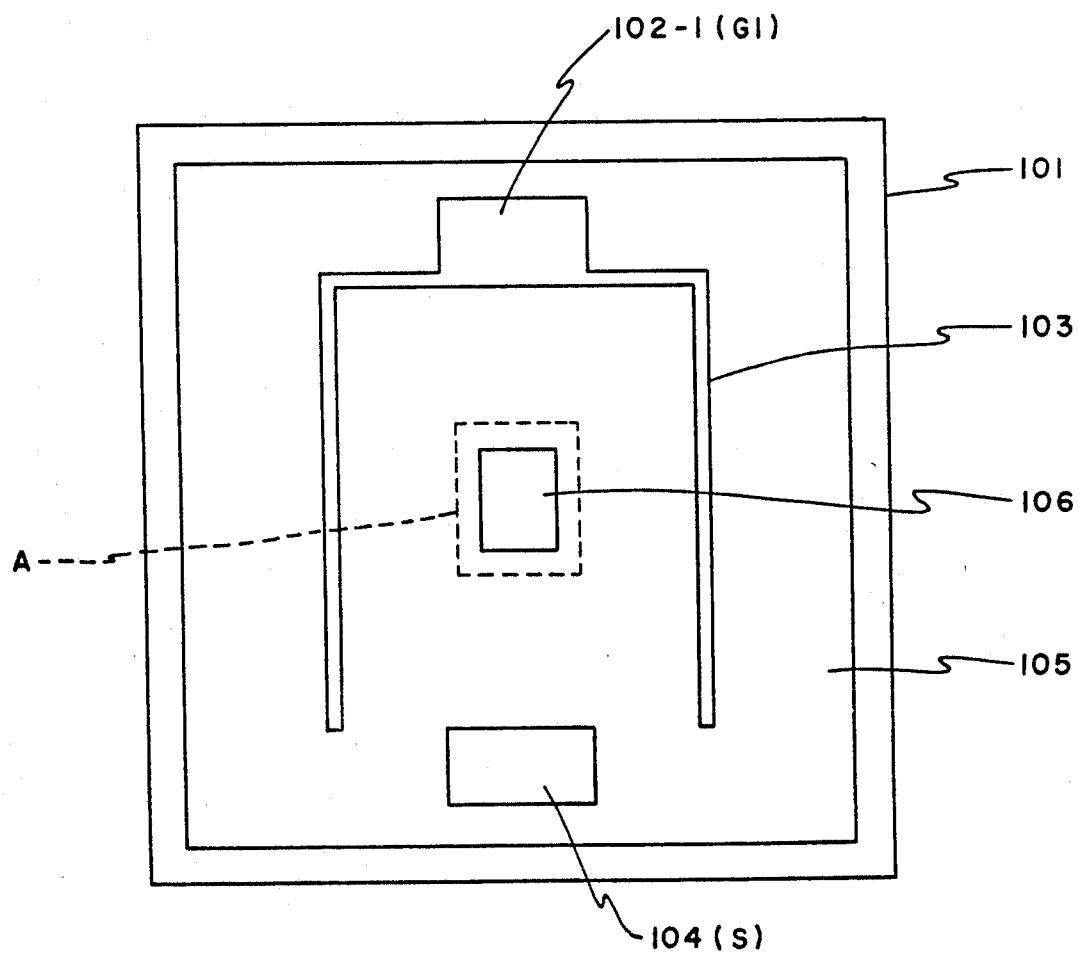
FIG. 2 is a schematic plan view of a semiconductor chip for describing an embodiment of the present invention.

Referring to FIG. 2, on the surface of a semiconductor chip 101 there are formed a first gate pad 102-1, a first gate electrode wiring 103, a source pad 104 and a source electrode 105. The MOS transistor T2 is provided in a temperature detection cell part 106 at the central part of the semiconductor chip 101.

Figure 3:
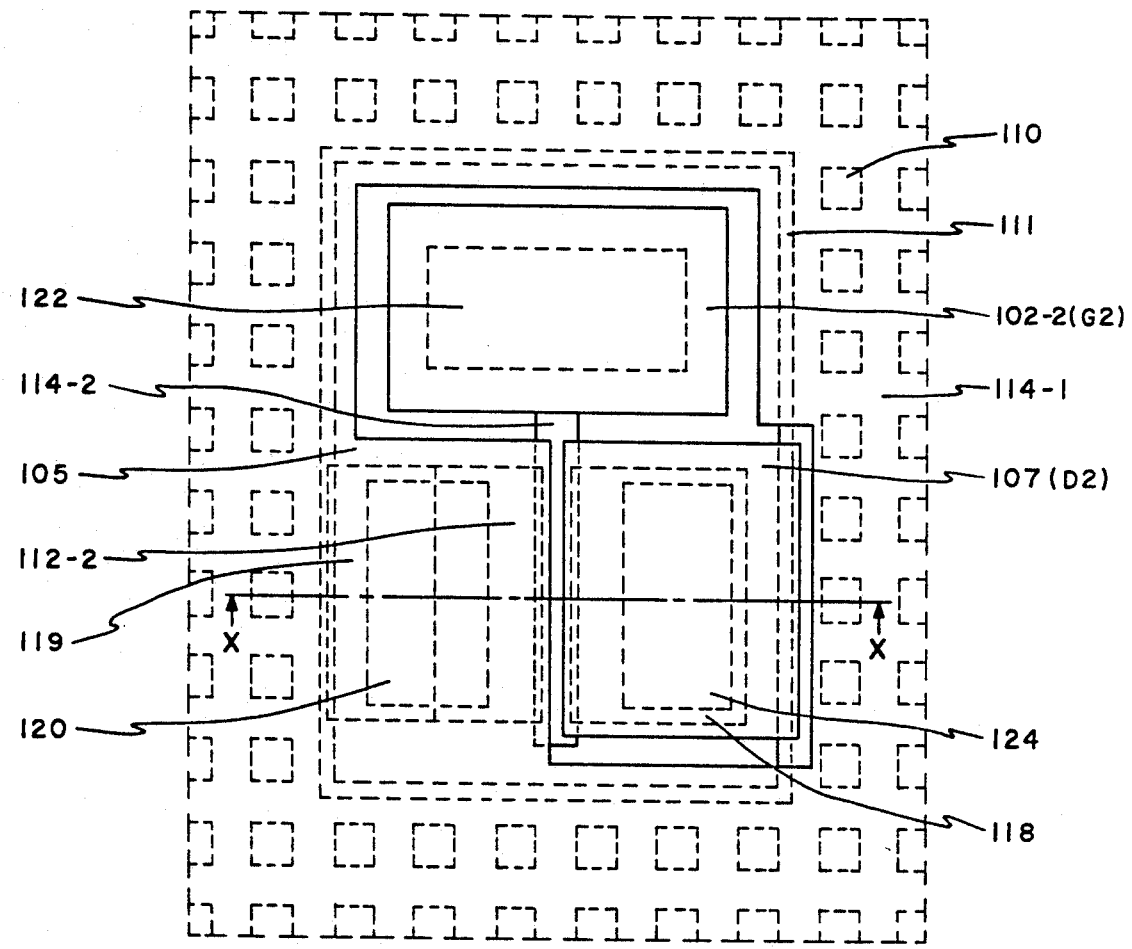
FIG. 3 is an enlarged schematic plan view of part A in FIG. 2.

Referring to FIG. 3, a second gate pad 102-2 and a second drain pad 107 are provided in the temperature detection cell part 106.

The semiconductor chip 101 is mounted on a package which is not shown. The first gate pad 102-1, the second gate pad 102-2, the second drain pad 107 and the source pad 104 are connected within the package to the first gate terminal (G1 in FIG. 1), the second gate terminal (G2), the second drain terminal (D2) and the source terminal (S), respectively, that are led out but not shown. In addition, a first drain electrode 117 (see FIG. 4) formed on the rear surface of the semiconductor chip 101 that will be described later is connected to the first drain terminal (D1).

Figure 4:
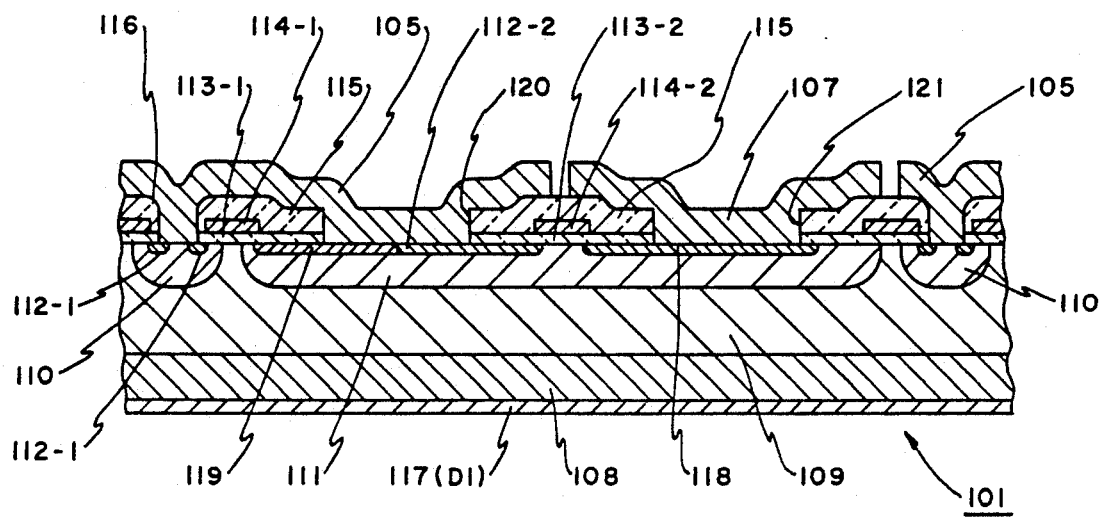
FIG. 4 is an enlarged sectional view along the line X—X in FIG. 3.

Referring to FIG. 4, the semiconductor chip 101 has a semiconductor substrate that consists of an N+ type silicon layer 108 which is doped with antimony of a concentration of about $2 \times 10^{18}$ atoms/cm$^3$ and an about 12 $\mu$-thick N− type epitaxial layer 109 with a resistivity of 1 $\Omega$-cm doped with phosphorus of about $5.6 \times 10^{15}$ atoms/cm$^3$.

In the surface part of the epitaxial layer 109, there are provided (except for the temperature detection cell parts) P type base regions 110 of from about 1,000 to 100,000 disposed at a constant pitch with a depth of about 3.5 $\mu$m and a surface concentration of about $1 \times 10^{18}$ atoms/cm$^3$. In addition, in a temperature detection cell part there is provided a P type well 111 independent of the base region 110. The depth of the well 111 needs only be about the same magnitude as that of the base region 110. Further, the occupancy area of a single base region 110 is about 10 $\mu$m $\times$ 10 $\mu$m and the occupancy area of a well 111 is about 100 $\mu$m $\times$ 100 $\mu$m.

Within each base region 110 there is formed an N+ type first source region 112-1. A first gate oxide film 113-1 with thickness of about 50 nm is formed on the outside portion of the first source region 112-1 of the base region 110. A first gate electrode 114-1 consisting of a polycrystalline silicon film with a thickness of about 600 nm and a sheet resistance of about 11 $\Omega$/square is formed on the first gate oxide film 113-1. The first gate electrode 114-1 covers the surface of the semiconductor chip in meshlike manner except for the temperature detection cell part (106 in FIG. 2). An interlayer insulating film 115 of such as phosphosilicate glass is provided covering the first gate electrode 114-1 and the first gate oxide film 113-1. The central part of the base region 110 and a part of the first source region 112-1 in the periphery of the region 110 are connected to an aluminum source electrode 105 via an opening 116 provided in the interlayer insulating film 115 and the first gate oxide film 113-1. On the rear surface of the semiconductor substrate there is provided an silver first drain electrode 117. The first gate electrode wiring 103 (see FIG. 2) is a U-shaped wiring formed on the interlayer insulating film 115 similar to the source electrode 105, and is connected to the first gate electrode 114-1 via an opening not shown. The first gate pad 102-1 (see FIG. 2) is an aluminum wiring similar to the first gate electrode wiring 103, and no opening is formed in the underlying interlayer insulating film. The source pad 104 (see FIG. 2) consists of an aluminum film on the same order of layer as the source electrode 105, the first gate pad 102-1 and the first gate electrode wiring 103. The source pad 104 is connected to the source electrode 105, but it is also connected to the underlying diffused layer through an opening formed in the interlayer insulating film below. The vertical field effect transistor described above has a feature in which a temperature detection cell part is formed at the central part of the semiconductor chip.

Next, the temperature detection cell will be described.

In the surface part of the epitaxial layer 109 there is formed a P− type well 111 independently of the base region 110. In the well 111 there are provided the N+ type second source region 112-2, an N+ type second drain region 118 and a P+ type contact region 119. The contact region 119 is provided in contact with the second source region 112-2. On the portion of the well 111 between the second source region 112-2 and the second drain region 118 there is provided a second gate oxide film 113-2 that consist of SiO$_2$ of thickness of about 50 nm. A second gate electrode 114-2 consisting of a polycrystalline silicon film with thickness of about 600 nm and sheet resistance of about 11 $\Omega$/square is provided on the second gate oxide film 113-2. An interlayer insulating film 115 is provided on the second gate electrode 114-2 and the second gate oxide film 113-2. The second source region 112-2 and the contact region 119 are connected to the source electrode 105 via an opening 120 formed in the interlayer insulating film 115. The second drain region 118 is connected to the second drain electrode 107 made of aluminum via an opening 121 formed in the interlayer insulating film 115. The second gate electrode 114-2 is a T-shaped polycrystalline silicon film is connected to the aluminum made second gate pad 102-2 via an opening 122 formed in the interlayer insulating film 115 as shown in FIG. 3. The second drain electrode 107 and the second gate pad 102-2 are respectively wire bonded with the external leads, not shown, of the package, and are led out to the second drain terminal (D2) and the second gate terminal (G2), respectively.

As is clear from the above description, the present embodiment is formed by integrating a DMOS transistor and a lateral MOS transistor in the same semiconductor chip.

Prior to proceeding to explain that the lateral MOS transistor can be used as a temperature detection cell, a fabrication method of the present embodiment will be described.

Figure 5A:
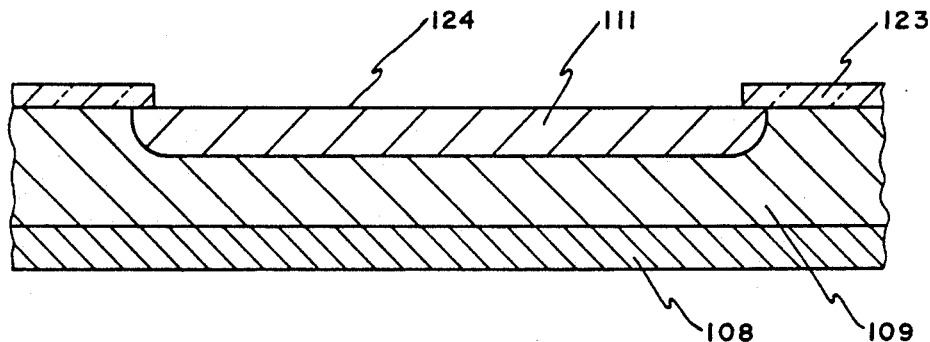
FIG. 5(a) to FIG. 5(e) are sectional views of the semiconductor chip arranged in the order of principal processes for describing the fabrication method of the embodiment.

First, as shown in FIG. 5(a), a silicon substrate which has the N− type epitaxial layer 109 deposited on the N+ type silicon layer 108 is prepared. Next, a silicon oxide film 123 with thickness of about 600 nm is formed by thermal oxidation on the surface of the epitaxial layer 109, then an opening 124 is formed in the silicon oxide film 123. Subsequently, boron ions are implanted through the opening 124 at an acceleration energy of 70 keV and at a rate of $1 \times 10^{12}$ to $5 \times 10^{14}$ atoms/cm$^2$, preferably to $1 \times 10^{13}$ atoms/cm$^2$, and a well 111 is formed by subjecting the sample to a heat treatment at 1200° C. for 60 minutes. The surface impurity concentration of the well 111 is $1 \times 10^{15}$ to $1 \times 10^{18}$ atoms/cm$^3$, preferably $3 \times 10^{16}$ atoms/cm$^3$, and its depth is 3 to 15 $\mu$m, preferably 5 $\mu$m.

Figure 5B:
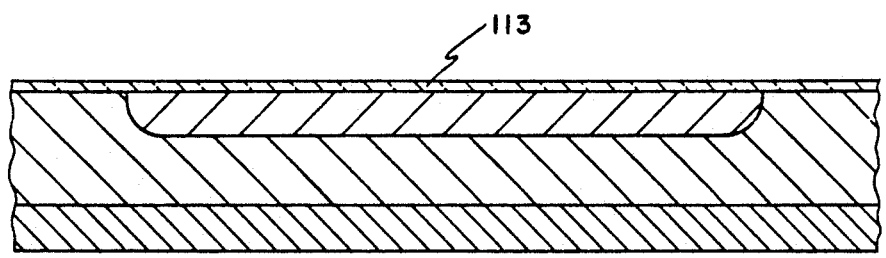

Next, after removal of the oxide silicon 123 in the element formation region in the periphery of the well 111, a silicon oxide film 113 with thickness of about 50 nm is formed as shown in FIG. 5(b).

Figure 5C:
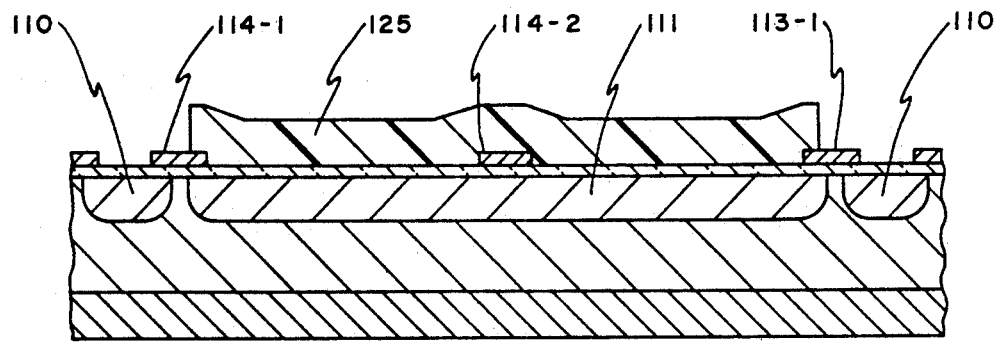

Next, a polycrystalline silicon film doped with phosphorus of about $5 \times 10^{19}$ atoms/cm$^3$ is formed on the silicon oxide film 113, and by patterning a first gate electrode 114-1 and a second gate electrode 114-2 are formed as shown in FIG. 5(c). Next, a photoresist film 125 is formed on the well 111, boron ions are implanted by using the photoresist 125 and the first gate electrode 114-1 as masks, the photoresist mask 125 is removed, and a base region 110 is formed by subjecting the sample to a heat treatment at about 1200° C. for 60 minutes. The dose of boron is about $8 \times 10^{13}$ atoms/cm$^2$ and the acceleration energy is 70 keV.

Figure 5D:
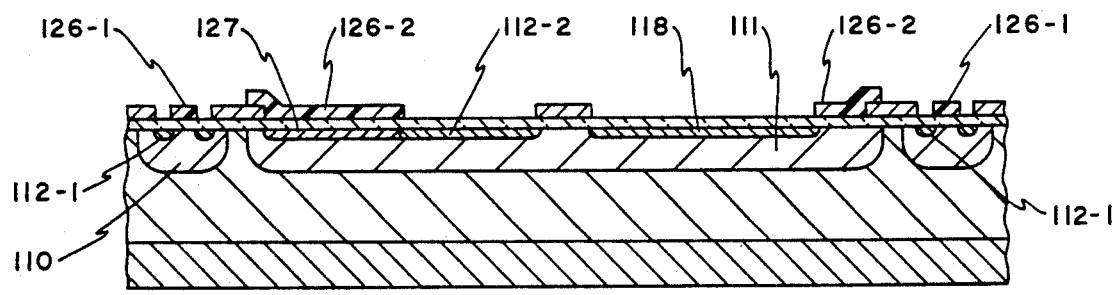

Next, as shown in FIG. 5(d), photoresist films 126-1 and 126-2 are formed. The photoresist 126-1 is a square film formed on the central part of each base region 110. The photoresist film 126-2 is a rectangular film formed on the well 111, and has an opening that traverses over the horizontal bar section of the letter T of the T-shaped second gate electrode 114-2. Next, phosphorus ions are implanted using the photoresist films 126-1 and 126-2, the first gate electrode 114-1 and the second gate electrode 114-2 as masks. The dose is about $5 \times 10^{15}$ atoms/cm$^2$, and the acceleration energy is 80 keV. The photoresist films 126-1 and 126-2 are removed, another photoresist film which is not shown is deposited, and boron ions are implanted by providing an opening which is not shown. The dose is about $5 \times 10^{15}$ atoms/cm$^2$, and the acceleration energy is 70 keV. When the photoresist film which is not shown is removed and the sample is subjected to a heat treatment at about 1000° C. for 30 minutes, there are formed N+ type first source region 112-1, the second source region 112-2 and the second drain region 118, and the P+ type contact region 127. The surface concentration and the depth of the N+ type impurity regions are about $1 \times 10^{20}$ atoms/cm$^3$ and about 1 μm, respectively, while the surface concentration and the depth of the P+ type contact region are substantially the same as those just mentioned.

Figure 5E:
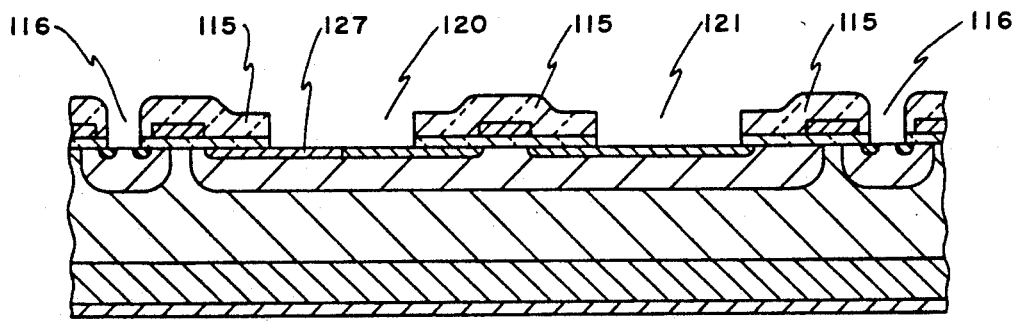

Next, a phosphosilicate glass film of thickness of about 500 nm is deposited by a CVD method as an interlayer insulating film 115, and openings 116, 120, 121 and 122 (see FIG. 3) as shown in FIG. 5(e). The opening is formed on each base region, the opening 120 is formed on the second source region 112-2 and the contact region 127, the opening 121 is formed on the second drain region 118 and the opening 122 is formed on the horizontal bar section of the letter T of the second gate electrode. Further, an opening is formed also at the location beneath the gate electrode wiring 103 in FIG. 2.

Next, an aluminum film of thickness of about 3.5 μm is deposited by an evaporation or a sputtering method, the aluminum film is patterned, and the first gate pad 102-1, the first gate wiring 103, the second gate pad 102-2, the source pad 104, the source electrode 105 and the second drain pad 107 are formed as shown in FIG. 2, FIG. 3 and FIG. 4.

Further, a silver film with thickness of about 1 μm is formed as the first drain electrode 117 on the rear surface of the silicon substrate 108 by an evaporation or a sputtering method.

Finally, the wafer is pelletized to be subdivided into semiconductor chips, mounted on packages, wire bonded, and sealed.

As described above, the present embodiment is obtained by integrating a DMOS transistor and a lateral MOS transistor on the same semiconductor substrate.

Figure 6:
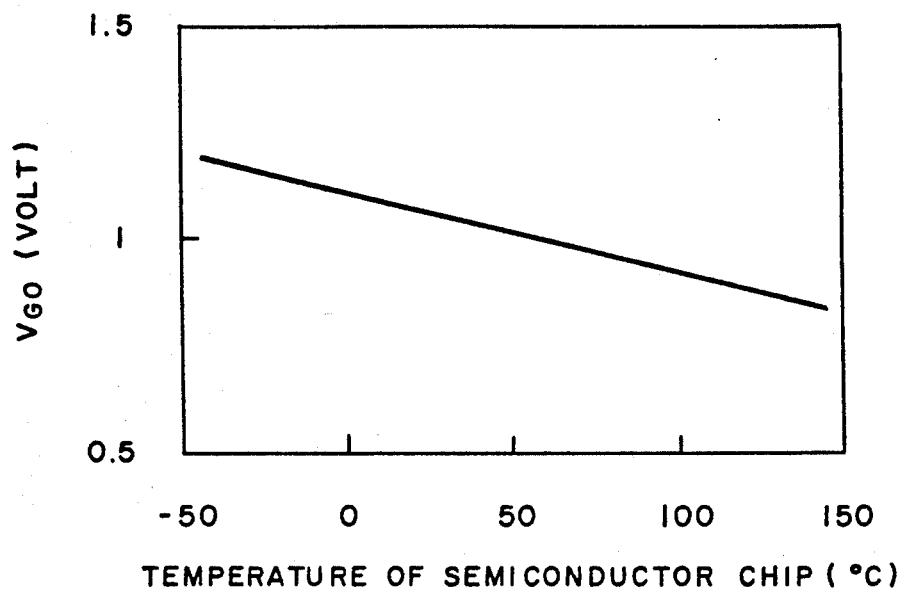
FIG. 6 is a graph showing the relation between the threshold voltage of the temperature detection cell and the temperature of the semiconductor chip.

When the gate terminal (the second gate terminal G2) and the drain terminal (the second drain terminal D2) of the lateral MOS transistor are commonly connected, the gate voltage $V_{G0}$ for keeping the current between the drain and the source at a predetermined value (in the present embodiment, for example, about 1 mA) is given as a linear function of the temperature of the semiconductor chip as shown in FIG. 6. The gradient of the linear function varies depending upon the impurity concentration of the well 111, the thickness of the second gate oxide film, the plane orientation of the semiconductor chip surface and the like, but it is about $-7$ mV/° C. when the (100) plane is selected in the present embodiment. Accordingly, it is possible to determine the temperature of the semiconductor chip by monitoring the gate voltage $V_{G0}$.

Figure 7:
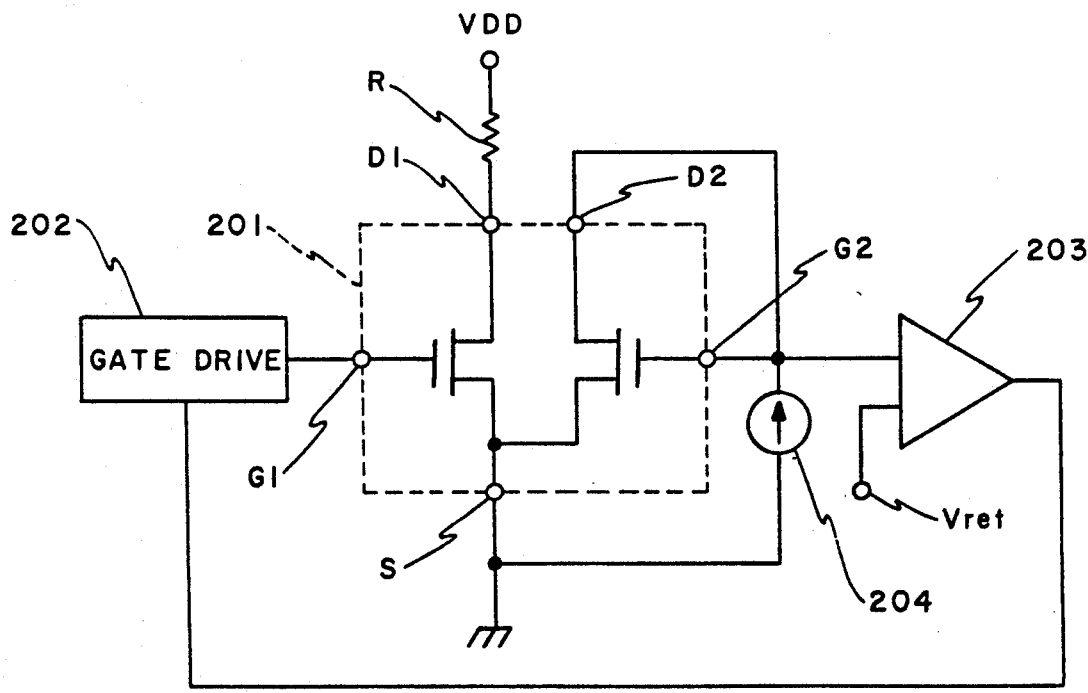
FIG. 7 is a circuit diagram for describing an example of chip temperature control at the time of use of the power semiconductor device in accordance with the present invention.

As shown in FIG. 7, a load resistor R is inserted between the first drain terminal D1 and a power supply $V_{DD}$ of the power semiconductor device 201 of the present embodiment. The first gate terminal G1 is connected to a gate drive circuit 202 which outputs predetermined pulses. The second gate terminal G2 and the second drain terminal D2 are connected. A constant current source 204 is connected between the source S, and the second gate terminal G2 and the second drain terminal D2. The voltage of the second gate terminal G2 and a reference voltage $V_{ref}$ are compared in a comparator 203, and when the voltage of the second gate terminal becomes lower than the reference voltage $V_{ref}$, the output voltage of the comparator 203 goes from "L" to "H". Upon receipt of the temperature detection signal the output signal from the gate drive circuit 202 is interrupted.

The current of the constant current source 204 is around 1 mA for the above embodiment. Since the lateral MOS transistor is driven by the constant current, the gate voltage $V_{G0}$ is equal to the voltage of the second gate terminal G2 provided that the gate current is neglected. The value of the reference voltage $V_{ref}$ may be chosen, for example, to be the gate voltage $V_{G0}(1\text{ V})$ at the time of the chip temperature of 150° C. In this way, if the temperature at the central part of the semiconductor chip exceeds 150° C., the driving of the DMOS transistor is stopped and the breakdown of the power semiconductor device due to heating can be prevented.

In the embodiment described above, the second drain pad 107 is isolated from the second gate pad 102-2. However, as is clear from the above explanation, it is not absolutely necessary to do so and they may be formed integrally.

It should be noted that the present invention is also applicable to the system in which the conductivity type and the polarity of the voltage are reversed.

Moreover, as the vertical field effect transistor for the power part, a vertical MOS transistor in which a V groove is formed on the surface of the semiconductor chip and the gate electrode is provided in the V groove part can be employed besides the DMOS transistor.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A power semiconductor device comprising:

a vertical field effect transistor having a base region of a first conductivity type selectivity formed on a main surface of a semiconductor substrate of a second conductivity type, a first drain region that includes a portion of said semiconductor substrate adjacent to said base region, a first source region of the second conductivity type formed within said base region, a first gate insulating film formed on said base region placed between said first source region and said first drain region and a first gate electrode formed on said first gate insulating film, a temperature detection cell comprising an MOS transistor having a well of the first conductivity type formed on said one main surface of said semiconductor substrate apart from said base region, a second source region and a second drain region of the second conductivity type formed respectively within said well, a second gate insulating film formed on said well between said second source region and said second drain region, and a second gate electrode formed on said second gate insulating film, and first means for supplying a first voltage to said first gate electrode of said vertical field effect transistor, for driving said vertical field effect transistor, second means for detecting a second voltage to be applied to said second gate electrode required for holding the current, that flows across the surface of said well found between said second source region and said second drain region of said MOS transistor, at a predetermined value and third means for inactivating said first means by detecting that said second voltage is above or below a predetermined value.

2. A power semiconductor device as claimed in claim 1, wherein said second means includes means for short-circuiting said second gate electrode and said second drain region.

* * * * *